United States Patent [19]
Jeong

[11] Patent Number: 6,031,704
[45] Date of Patent: Feb. 29, 2000

[54] ELECTROSTATIC PROTECTION CIRCUIT IN A SEMICONDUCTOR DEVICE

[75] Inventor: Jae Goan Jeong, Ichon, Rep. of Korea

[73] Assignee: Hyundai Electronics Industries Co., Ltd., Kyoungki-do, Rep. of Korea

[21] Appl. No.: 09/105,305

[22] Filed: Jun. 26, 1998

[30] Foreign Application Priority Data

Jun. 28, 1997 [KR] Rep. of Korea .................. 97-28745

[51] Int. Cl.[7] ................................................ H02H 9/00
[52] U.S. Cl. .............................. 361/111; 361/56; 361/58; 361/118; 361/119
[58] Field of Search .................... 361/56, 58, 111, 361/91, 118, 119, 127

[56] References Cited

U.S. PATENT DOCUMENTS

| | | | |
|---|---|---|---|
| 4,990,802 | 2/1991 | Smooha | 307/482.1 |
| 5,059,831 | 10/1991 | Itoh | 307/482.1 |
| 5,347,185 | 9/1994 | Tailliet | 307/540 |
| 5,654,860 | 8/1997 | Casper et al. | 361/91 |
| 5,689,132 | 11/1997 | Ichikawa | 257/357 |

*Primary Examiner*—Stephen W Jackson
*Attorney, Agent, or Firm*—Thelen Reid & Priest, LLP

[57] ABSTRACT

A power line and a ground line of a bipolar transistor for the electrostatic protection are isolated from a power line and a ground line of an active transistor for data input and output. Also, a resistor is coupled between a power line and a ground line of an active transistor for data input and output, and another resistor is coupled between a pad and the active transistor. Accordingly, the active transistor for data input and output is operated as an internal circuit in the electrostatic protection test since main current flows toward the bipolar transistor. An electrostatic protection circuit according to the present invention uses a bipolar transistor for the electrostatic protection and uses an active transistor for data input and output as an internal circuit in order to increase transistor size. Accordingly, a rated current of a data input and output pad is satisfied as well as the data pin capacitance is reduced since the distance between a gate and a contact in an active transistor is decreased.

9 Claims, 7 Drawing Sheets

ELECTROSTATIC PROTECTION CIRCUIT IN A SEMICONDUCTOR DEVICE

FIELD OF THE INVENTION

This invention relates to an electrostatic protection circuit. In particular, it relates to an electrostatic protection circuit that can satisfy a rated current of a data input and output pad and have small capacitance.

DESCRIPTION OF THE RELATED PRIOR ART

Recently, a semiconductor has been highly integrated and various semiconductor products have been developed. Therefore, problems related to data pin capacitance and an electrostatic protection circuit have been raised. Conventional electrostatic protection circuits as shown in FIGS. 1 and 2 will be explained with reference to a layout of FIG. 10.

Figure 1:
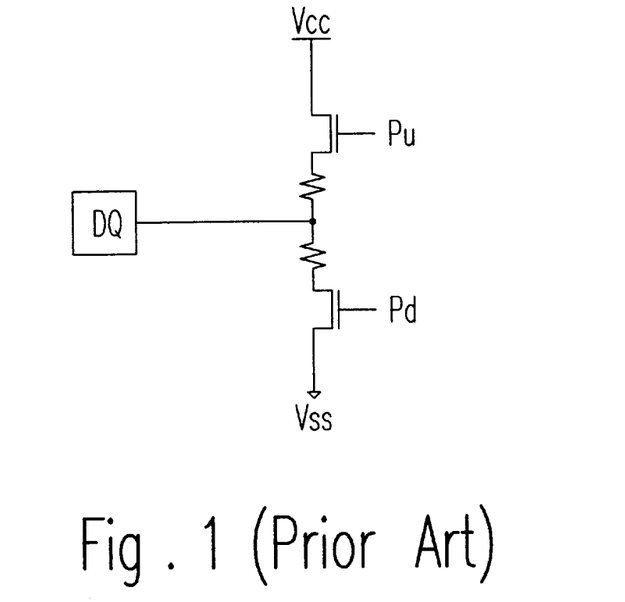
FIG. 1 illustrates a conventional electrostatic protection circuit of a data input and output pad.

FIG. 1 shows a conventional electrostatic protection circuit in a data input and output pad. A bipolar transistor for electrostatic protection is coupled between a Vcc power line and a pad, and between a Vss ground line and the pad. A pull up transistor is coupled to the Vcc power line, and a pull down transistor is coupled to the Vss ground line.

In FIG. 1, during an electrostatic test, the main current flows from the pad to the Vcc power line and the Vss power line throws the pull up and pull down transistors. Heat is generated by the electrostatic jagging when main current flows. This heat interfers with the operation from properly working. Accordingly, the electrostatic protection circuit must have a structure to protect transistors. Also, an operation region of a transistor such as an active junction requires a sufficient area. Such an electrostatic protection circuit brings about the problem of increasing the data pin capacitance.

Figure 2:
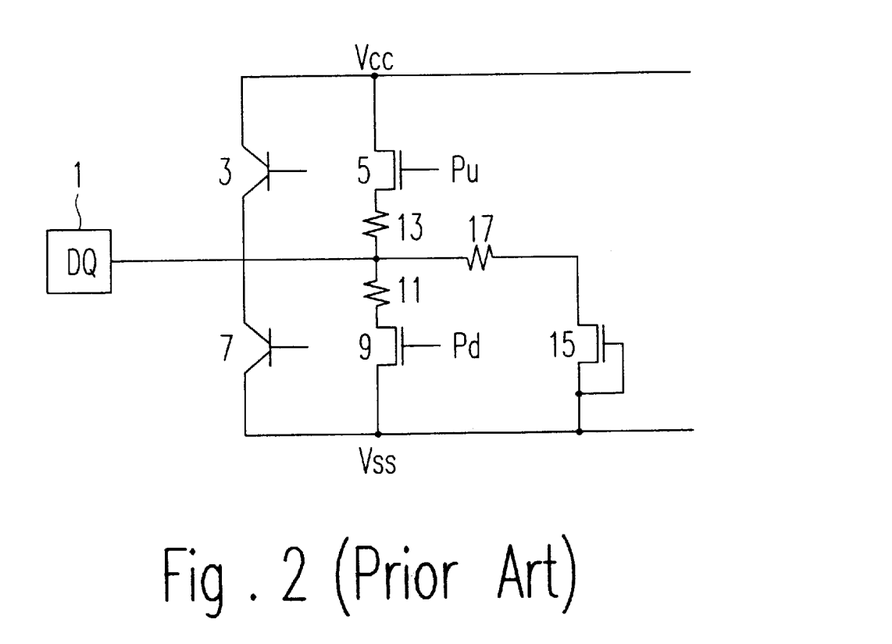
FIG. 2 illustrates another conventional electrostatic protection circuit of a data input and output pad.

FIG. 2 shows an improved conventional electrostatic protection circuit in a data input and output pad. Bipolar transistors 3 and 7 for electrostatic protection are coupled between a pad and a Vcc power line, while active transistors 5 and 9 for electrostatic protection are coupled between the pad and a Vss power line, respectively. Between the pad and the active transistor 5, resistor 13 is connected and between the pad and the active transistor 9, resistor 11 is connected. A resistor 17 and an active diode transistor 15 are in series connected between the pad and the Vss power line.

Figure 10:
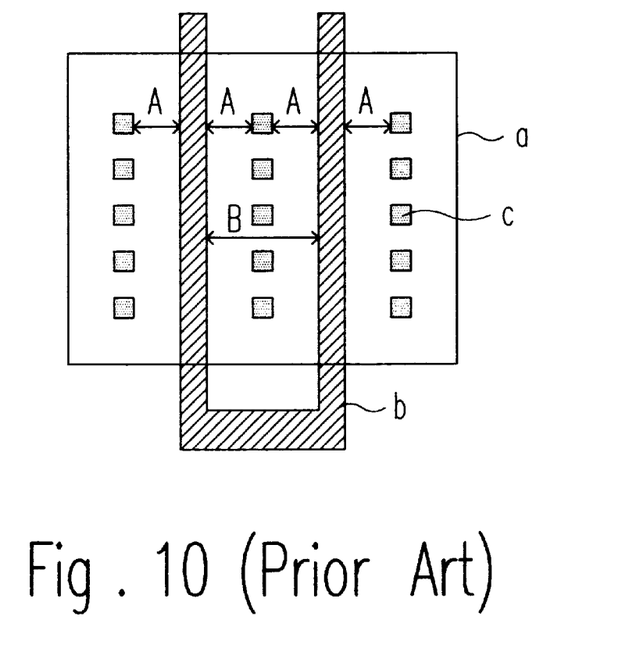
FIG. 10 illustrates a layout of an active transistor for an electrostatic protection circuit of a data input and out pad according to a prior art.

FIG. 10 shows a layout of an active transistor of FIGS. 1 and 2 to input and output a data. Distance A between gate b and contact c is too long for protecting the static electricity, and area B of an operation region being connected to a pad is also too long, thereby increasing the data pin capacitance due to increment of junction capacitance. When the size of the transistor becomes too large to increase input and output current, the data pin capacitance is increased further.

However, to satisfy a rated current of a data input and output pad, the size of the active transistor must be increased. If the current is increased, the area of the active region becomes large, and therefore increases the data pin capacitance. However, it is desirable that the data pin capacitance and the junction capacitance is small.

If the area of operation region in the active transistor is decreased, the junction capacitance and the data pin capacitance become small. To decrease the area of the operation region in the active transistor, the distance between a gate electrode and a contact must be decreased. However, it is difficult to decrease the distance between a gate electrode and a contact in circuit structure of FIGS. 1, 2 and 10.

SUMMARY OF THE INVENTION

Therefore, it is an object of the present invention to provide an electrostatic protection circuit in a semiconductor device which can satisfy a rated current of a data input and output pad by using a bipolar transistor for ESD protection, an active transistor for data input and output like an internal circuit and by increasing the size of a transistor.

Another object of the present invention is to provide an electrostatic protection circuit in a semiconductor device which can decrease a data pin capacitance by decreasing the distance between a gate electrode and a contact in an active transistor.

To achieve the above objects, a power line and a ground line of a bipolar transistor for the ESD protection are isolated from the power line and the ground line of an active transistor for data input and output. Also, a resistor is coupled between a power line and a ground line of an active transistor for data input and output, and another resistor is coupled between a pad and the active transistor, whereby the active transistor for data input and output is operated like an internal circuit when the electrostatic protection test occurs since main current flows toward the bipolar transistor.

An electrostatic protection circuit in a semiconductor comprises: a first bipolar transistor coupled between a pad and a ground line; a first active transistor of which one electrode is connected to the pad via a first resistor and another electrode is connected to the ground line via a second resistor; a second active transistor of which one electrode is connected to the pad via a fourth resistor and the other electrode is connected to a power line via a fifth resistor; and an active diode transistor of which one electrode is connected to the ground line and the other electrode is connected to the pad via a third resistor.

Distance between a gate and a contact of the active transistors is identical to that of an internal circuit.

An electrostatic protection circuit in a semiconductor device comprises: an active transistor coupled between a pad and a ground line; and an active diode transistor is coupled to said pad via said ground line and a resistor.

An electrostatic protection circuit in a semiconductor device includes a bipolar transistor coupled between the pad and the power line, and the active transistor includes the active diode transistor.

BRIEF DESCRIPTION OF THE DRAWINGS

For a full understanding of the nature and objects of the present invention, reference should be made to the following detailed descriptions made in conjunction with the accompanying drawings in which.

Similar reference characters refer to similar parts through several perspectives of the drawings.

DETAILED DESCRIPTION OF THE PRESENT INVENTION

Below, embodiments of the present invention will be explained with reference to attached drawings.

Figure 3:
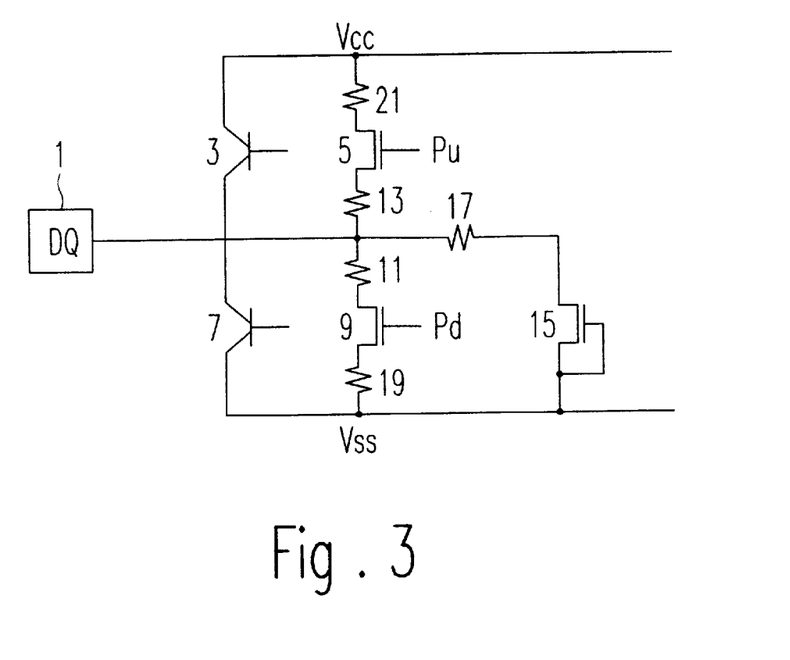
FIG. 3 is an electrostatic protection circuit of a data input and output pad according to the present invention.

FIG. 3 is an electrostatic protection circuit of a data input and output pad 1 according to the present invention. A second bipolar transistor 3 is coupled between the pad 1 and a power line Vcc and an second active transistor 5 which is a pull up transistor is also coupled between the pad 1 and the power line Vcc. A first bipolar transistor 7 is coupled between the pad 1 and a ground line Vss and a first active transistor 9 which is a pull up transistor is also coupled between the pad 1 and the power line Vss. A fourth resistor 13 is coupled between the pad 1 and the second active transistor 5, and a first resistor 11 is coupled between the pad 1 and the first active transistor 9.

A third resistor 17 and an active diode transistor 15 are in series coupled between the pad 1 and the ground line Vss. A fifth resistor 21 is coupled between the pad 1 and the second active transistor 5. A second resistor 19 is coupled between the pad 1 and the ground line Vss.

The active transistors 5 and 9 may be used as an internal circuit since the main current flows toward the bipolar transistors 3 and 7 due to the resistors 19 and 21.

Here, the resistance of the second resistor 19 connected between the active transistor 5 and the power line Vcc may be 50 through 100 W. It is desirable that the resistance of the second resistor 19 is greater than that of the first resistor connected between the active transistor 5 and the power line Vcc. The resistance of the second resistor 21 connected between the active transistor 9 and the ground line Vss may be 50 through 100 W. It is desirable that the resistance of the second resistor 21 is greater than that of the fourth resistor connected between the active transistor 5 and the ground line Vcc.

In the electrostatic protection circuit as shown in FIG. 3, a current flows to the Vcc/Vss power lines during the ESD test. When the ESD jagging occurs, the main current flows through the bipolar transistor 15, which is caused by the resisters 21 and 19, while the current path passing through the pull up and pull down transistors is not formed. Hence, the active junction of the pull up transistor and the pull down transistor can be formed in small size, thereby decreasing the data pin capacitance. In this case, the bipolar transistor 15 coupled between the pad and the ground line has a NPN structure, and the bipolar transistor coupled to the power lines has a PNP structure, and thereby decreasing the size of the junction region in the pull up transistor and the pull down transistor even further. Accordingly, the ESD protection characteristics may be improved.

Figure 4:
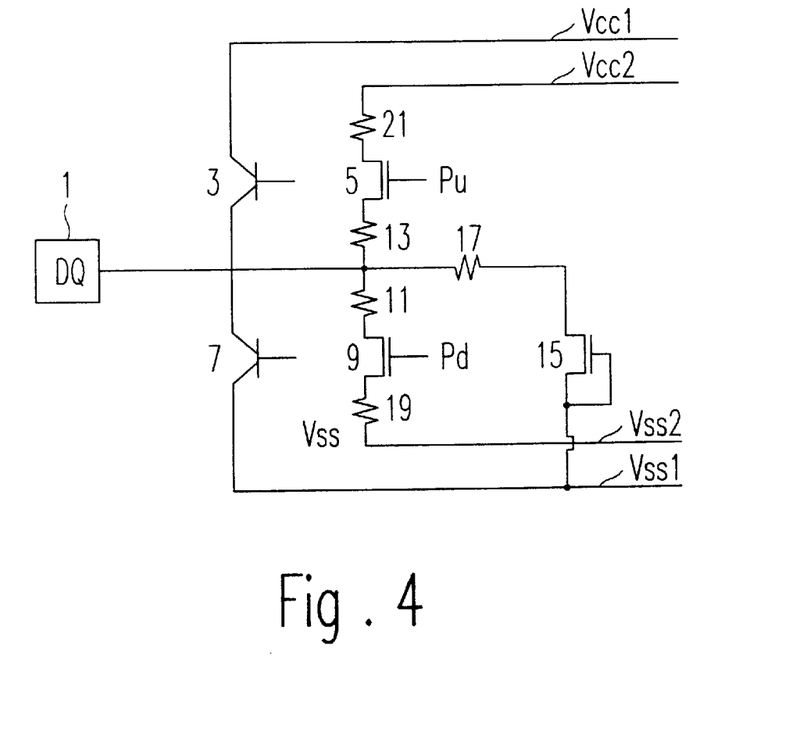
FIG. 4 through FIG. 9 are electrostatic protection circuits of a data input and output pad according to various embodiments of the present invention.

FIG. 4 shows an electrostatic protection circuit according to another embodiment of the present invention. The electrostatic protection circuit comprises of: a first bipolar transistor 7 coupled between a pad 1 and a first ground line; a first active transistor 9 of which one electrode is connected to a second ground line via a second resistor 19 and the other electrode is connected to the pad 1 via a first resistor 11; an active diode transistor 15 of which one electrode is connected to the first ground line and other electrode is connected to the pad 1 via a third resistor 17; a second bipolar transistor 3 connected between the pad 1 and a first power line; and a second active transistor 5 of which one electrode is connected to the pad 1 via a fourth resistor 13 and other electrode is connected to a second power line via a fifth resistor 21.

Here, the resistance of the second and fifth resistors 19 and 21 may be 10 through 100 W, in which the second resistor 19 is connected between the active transistor 9 and the second ground line, the fifth resistor 21 is connected to the active transistor 5 and the second power line. It is desirable that the resistance of the second and fifth resistors 19 and 21 is larger than that of the first and fourth resistors 11 and 13.

The operation of the electrostatic protection circuit as shown in FIG. 4 is identical to that of FIG. 3. The power lines and the ground lines are isolated from each other, thereby improving the ESD protection characteristics.

Figure 5:
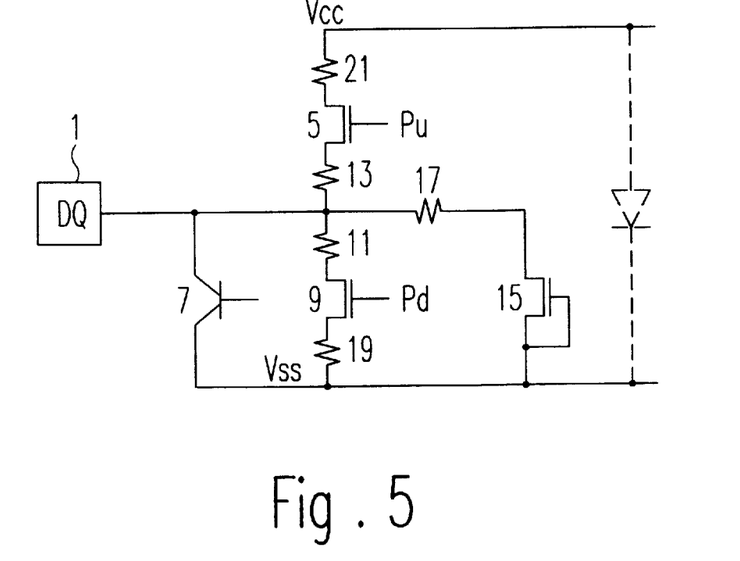

FIG. 5 shows an electrostatic protection circuit according to another embodiment of the present invention. FIG. 5 is identical to FIG. 3 except that the diode junction is formed between a well guarding (Vcc) and a power line (Vss) by parasitic phenomenon without the second bipolar transistor 3 providing electrostatic protection of FIG. 3.

Here, the resistance of the second and fifth resistors 19 and 21 may be 10 through 100 W. It is desirable that the resistance of the second and fifth resistors 19 and 21 is larger than that of the first and fourth resistors 11 and 13.

FIG. 5 shows embodiment in which a diode having parasitic property is used to pass the main current of the power line when the ESD jagging occurs. According to the embodiment of FIG. 5, the ESD protection characteristics is improved.

Figure 6:
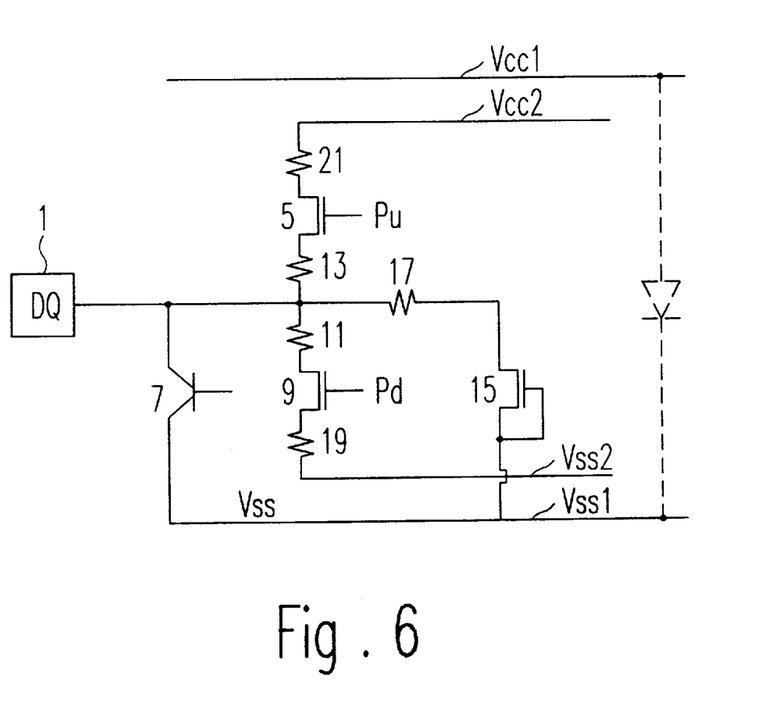

FIG. 6 shows an electrostatic protection circuit according to another embodiment of the present invention. FIG. 6 is identical to FIG. 5 except that a diode junction is formed between an well guarding (Vcc) and a power line (Vss) by a parasitic phenomenon without the second bipolar transistor 3 which is connected to a first power line Vcc.

Here, the resistance of the second and fifth resistors 19 and 21 may be 10 through 100 W. It is desirable that the resistance of the second and fifth resistors 19 and 21 is larger than that of the first and fourth resistors 11 and 13.

In the electrostatic protection circuit of FIG. 6, the power lines and the ground lines are isolated from each other and the ESD protection characteristics is more effective than that of FIG. 5.

Figure 7:
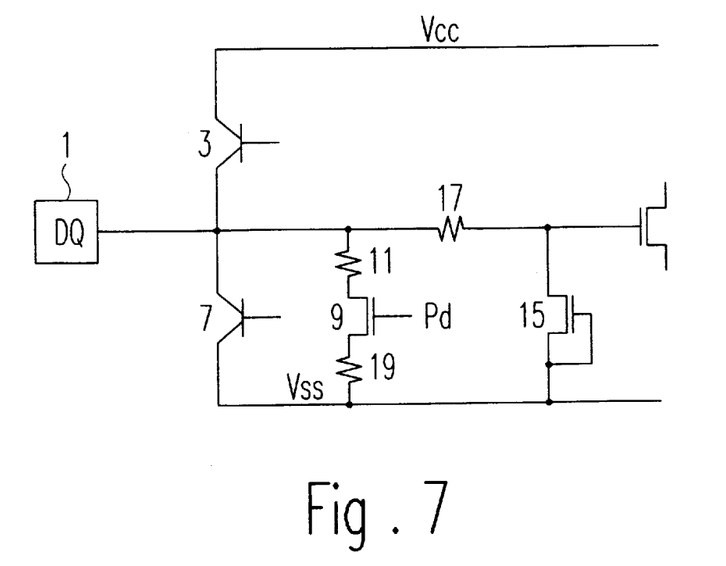

FIG. 7 shows an electrostatic protection circuit according to another embodiment of the present invention. FIG. 7 is identical to FIG. 3 except that an internal circuit is used without the second active transistor 5 which is connected to a power line Here, the resistance of the second and fifth resistors 19 and 21 may be 10 through 100 W. It is desirable that the resistance of the second and fifth resistors 19 and 21 is larger than that of the first and fourth resistors 11 and 13.

The electrostatic protection circuit of FIG. 7 has the ESD protection circuit without the use of the pull up transistor for input and output.

Figure 8:
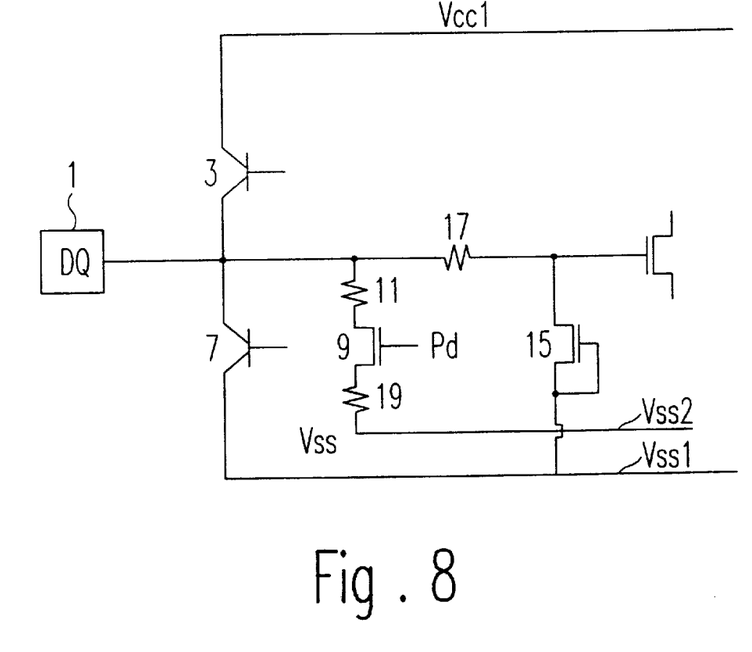

FIG. 8 shows an electrostatic protection circuit according to another embodiment of the present invention. FIG. 8 is identical to FIG. 7 except that an internal circuit is only used without the second active transistor 5 which is connected to a second power line.

Here, the resistance of the second and fifth resistors 19 and 21 may be 10 through 100 W. It is desirable that the resistance of the second and fifth resistors 19 and 21 is larger than that of the first and fourth resistors 11 and 13.

In the electrostatic protection circuit of FIG. 8, the power lines and the ground lines are isolated from each other and the ESD protection characteristics is more effective than that of FIG. 7.

Figure 9:
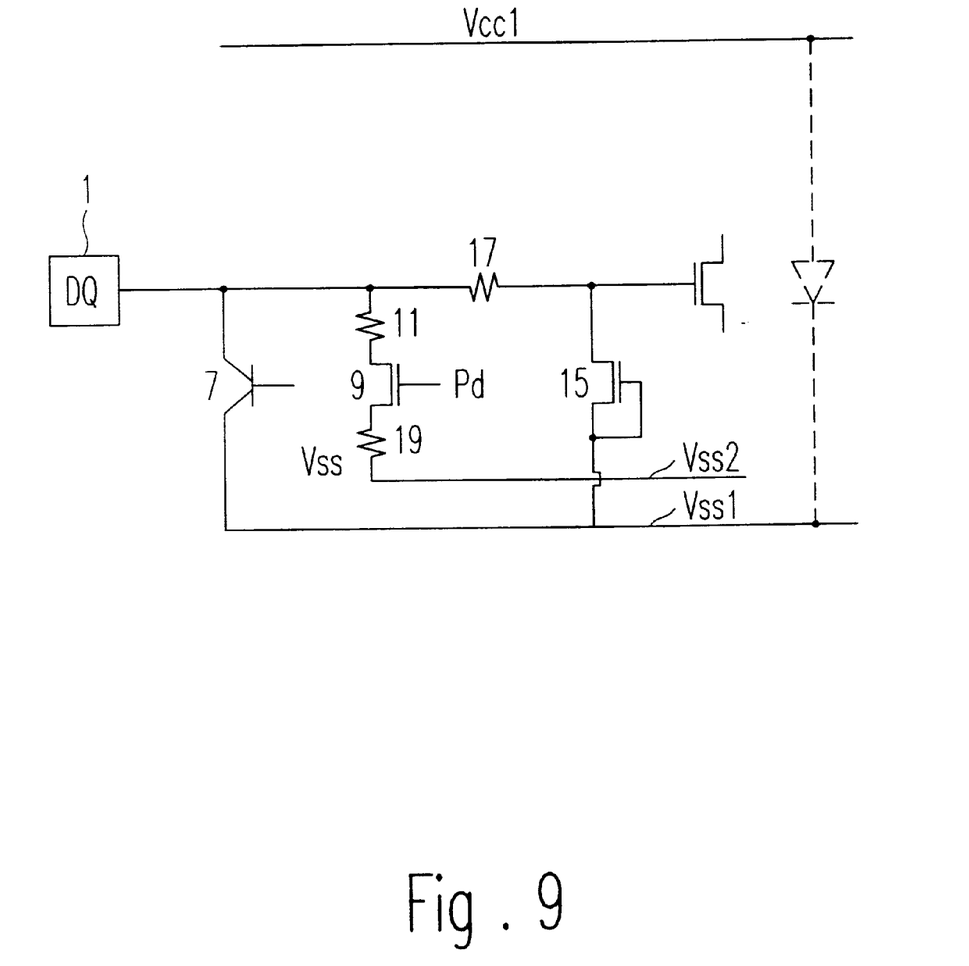

FIG. 9 shows an electrostatic protection circuit according to another embodiment of the present invention. FIG. 8 is identical to FIG. 4 except that an internal circuit is only used without the second bipolar transistor 3 and the second active transistor 5 which are connected to first and second power lines.

Here, the resistance of the second and fifth resistors 19 and 21 may be 10 through 100 W. It is desirable that the resistance of the second and fifth resistors 19 and 21 is larger than that of the first and fourth resistors 11 and 13.

In the electrostatic protection circuit of FIG. 8, the power lines and the ground lines are isolated from each other and the ESD protection characteristics is more effective than that of FIG. 5

Figure 11:
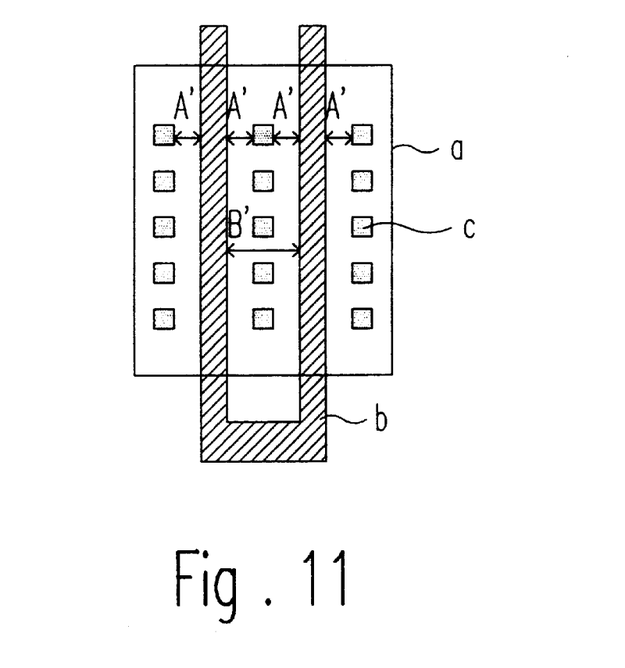
FIG. 11 illustrates a layout of an active transistor for an electrostatic protection circuit of a data input and out pad according to the present invention.

FIG. 11 illustrates a layout of an active transistor in FIGS. 4 and 9. According to the layout of FIG. 11, distance A' between gate b and contact c is decreased, and thereby area B' of operation region a connected to pad 1 is decreased. Accordingly, the junction capacitance is decreased and the data pin capacitance is effectively decreased.

Figure 12:
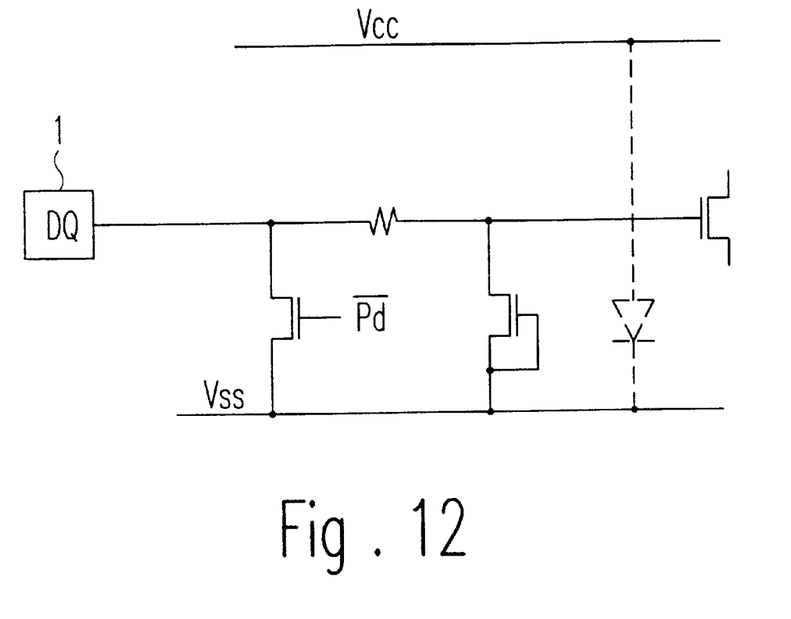
FIG. 12 is an electrostatic protection circuit of a data input and output pad according to another embodiment of the present invention.

FIG. 12 shows an electrostatic protection circuit according to another embodiment of the present invention. In FIG. 2, an ESD protection circuit has a pull down transistor connected between a pad and a ground line Vss. An active diode transistor is coupled between the pad and the ground line and a resistor is connected between the pad and the active diode transistor.

In FIG. 12, the main current path is formed only passes through the pull up and pull down transistors toward the ground line Vss when the ESD japping, while the main current toward Vcc power is formed passes through a parasitic diode formed between the power line and the ground line.

In this case, since the main current path is formed passing through the pull up and pull down transistors, this part functions as a protection circuit. Although the area of the active junction must be large, only one active transistor is used so that the protection condition is satisfied within a limited area that does not occur the electric capacitance. There is an effect which can decrease chip size.

FIG. 12 shows an electrostatic protection circuit according to another embodiment of the present invention. The structure of FIG. 13 is identical to that of FIG. 12 except for the use of the bipolar transistor between the pad and the power line Vcc.

Figure 13:
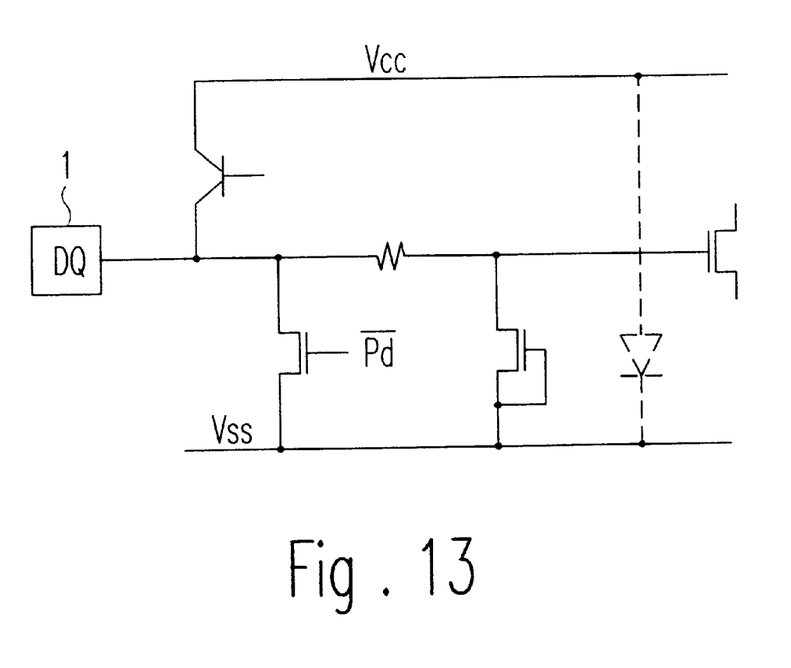
FIG. 13 is an electrostatic protection circuit of a data input and output pad according to another embodiment of the present invention.

In FIG. 13, the main current path is formed while passing through the pull up and pull down transistors toward the ground line Vss when the ESD japping, while main current toward Vcc power is formed pass through the bipolar transistor.

In this case, the main current path is formed while passing through the pull up and pull down transistors, and the bipolar transistor is connected to the power line. Accordingly, the electrostatic protection characteristics is improved.

As described above, an electrostatic protection circuit according to the present invention uses a bipolar transistor for the electrostatic protection and uses an active transistor for data input and output as an internal circuit in order to increase transistor size. Accordingly, a rated current of a data input and output pad is satisfied. Also, the data pin capacitance is reduced since the distance between a gate and a contact in an active transistor is decreased.

Although this invention has been described in its preferred form with a certain degree of peculiarity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. An electrostatic discharge protection circuit in a semiconductor device, the circuit comprising:
   a first bipolar transistor coupled between a pad and a ground line;
   a second bipolar transistor coupled between said pad and a power line;
   a first active transistor of which one electrode is connected to said pad via a first resistor and a second electrode is connected to said ground line;
   a second active transistor of which one electrode is connected to said pad via a second resistor and a second electrode is connected to said power line;
   an active diode transistor of which one electrode is connected to said ground line and a second electrode is connected to said pad via a third resistor;
   a fourth resistor, coupled between said second electrode of said first active transistor and said ground line; and
   a fifth resistor, coupled between said second electrode of said second active transistor and said power line;
   wherein:
   a resistance of said fourth resistor is larger than a resistance of said first resistor; and
   a resistance of said fifth resistor is larger than a resistance of said second resistor.

2. The circuit of claim 1, wherein:
   a distance between a gate and a contact of said active transistors is identical to that of an internal circuit.

3. An electrostatic discharge protection circuit in a semiconductor device, the circuit comprising:
   a first bipolar transistor coupled between a pad and a first ground line;
   a second bipolar transistor coupled between said pad and a first power line;
   a first active transistor of which one electrode is connected to said pad via a first resistor and a second electrode is connected to a second ground line;
   a second active transistor of which one electrode is connected to said pad via a second resistor and a second electrode is connected to a second power line;
   an active diode transistor of which one electrode is connected to said first ground line and a second electrode is connected to said pad via a third resistor;
   a fourth resistor, coupled between said second electrode of said first active transistor and said second ground line; and
   a fifth resistor, coupled between said second electrode of said second active transistor and said second power line;
   wherein:
   a resistance of said fourth resistor is larger than a resistance of said first resistor; and
   a resistance of said fifth resistor is larger than a resistance of said second resistor.

4. The circuit of claim 3, wherein:
   a distance between a gate and a contact of said active transistors is identical to that of an internal circuit.

5. An electrostatic discharge protection circuit in a semiconductor device, the circuit comprising:
- a power line;
- an active transistor coupled between a pad and a ground line; and
- an active diode transistor of which one electrode is connected to said pad and an internal circuit via a resistor and a second electrode is connected to said ground line.

6. The circuit of claim 5 further comprising:
- a bipolar transistor coupled between said pad and said power line.

7. An electrostatic discharge protection circuit in a semiconductor device, the circuit comprising:
- a bipolar transistor coupled between a pad and a ground line;
- a first active transistor of which one electrode is connected to said pad via a first resistor and a second electrode is connected to said ground line;
- a second active transistor of which one electrode is connected to said pad and an internal circuit via a second resistor and a second electrode is connected to a power line;
- an active diode transistor of which one electrode is connected to said ground line and a second electrode is connected to said pad and said internal circuit via a third resistor;
- a fourth resistor, coupled between the second electrode of the first active transistor and said ground line; and
- a fifth resistor, coupled between said second electrode of said second active transistor and said power line;

wherein:
- a resistance of said fourth resistor is larger than a resistance of said first resistor; and
- a resistance of said fifth resistor is larger than a resistance of said second resistor.

8. An electrostatic discharge protection circuit in a semiconductor device, the circuit comprising:
- a first bipolar transistor coupled between a pad and a first ground line;
- a second bipolar transistor connected between said pad and a power line;
- an active transistor of which one electrode is connected to said pad via a first resistor and a second electrode is connected to a second ground line;
- an active diode transistor of which one electrode is connected to said first ground line and a second electrode is connected to said pad and an internal circuit via a third resistor; and
- a second resistor, coupled between said second electrode of said active transistor and said second ground line;
- wherein a resistance of said second resistor is larger than a resistance of said first resistor.

9. An electrostatic discharge protection circuit in a semiconductor device, the circuit comprising:
- a bipolar transistor coupled between a pad and a first ground line;
- an active transistor of which one electrode is connected to said pad via a first resistor and a second electrode is connected to a second ground line;
- an active diode transistor of which one electrode is connected to said first ground line and a second electrode is connected to said pad and an internal circuit via a third resistor; and
- a second resistor, coupled between said second electrode of said active transistor and said second ground line;
- wherein a resistance of said second resistor is larger than a resistance of said first resistor.

* * * * *